United States Patent [19]

Takada et al.

[11] Patent Number: 4,946,709
[45] Date of Patent: Aug. 7, 1990

[54] METHOD FOR FABRICATING HYBRID INTEGRATED CIRCUIT

[75] Inventors: Mitsuyuki Takada; Eishi Gofuku; Hayato Takasago, all of Hyogo, Japan

[73] Assignee: Mitsubishi Denki Kabushiki Kaisha, Tokyo, Japan

[21] Appl. No.: 395,213

[22] Filed: Aug. 17, 1989

Related U.S. Application Data

[63] Continuation of Ser. No. 220,724, Jul. 18, 1988, abandoned.

[51] Int. Cl.$^5$ ............................................. H01C 17/06
[52] U.S. Cl. ........................................ 427/98; 29/620; 427/126.2
[58] Field of Search .................... 29/620, 846; 427/96, 427/98, 126.2

[56] References Cited

U.S. PATENT DOCUMENTS

| 3,050,420 | 8/1962 | Wasserman | 29/620 X |
| 3,648,363 | 3/1972 | Buzard et al. | 29/620 X |
| 3,725,743 | 4/1973 | Murayama | 427/96 X |
| 3,725,836 | 4/1973 | Wada et al. | 29/620 X |
| 4,347,265 | 8/1982 | Washo | 427/126.2 X |
| 4,464,420 | 8/1984 | Taguchi et al. | |
| 4,639,391 | 1/1987 | Kuo | 29/620 X |
| 4,651,126 | 3/1987 | Kumar et al. | 29/620 X |
| 4,685,203 | 8/1987 | Takada et al. | |
| 4,742,362 | 5/1988 | Takoshima et al. | 427/126.2 X |

FOREIGN PATENT DOCUMENTS 59-112681  6/1984  Japan .

OTHER PUBLICATIONS

Co-pending U.S. Patent Application No. 825,996 Entitled "Method for Producing Hybrid Integrated Circuit Substrate".

Primary Examiner—Joseph M. Gorski
Attorney, Agent, or Firm—Lowe, Price, LeBlanc, Becker & Shur

[57] ABSTRACT

A method for fabricating a hybrid IC substrate comprises the steps of: preparing an insulating ceramic substrate having a major surface; baking one or more conductors of a first group formed of high melting point metal or alloy thereof on the major surface; covering the conductors of the first group with a first plated film formed by electroless plating; forming an insulating porous active including a glass component and a small amount of a metal component having a catalytic action for electroless plating on the first plated film; and forming one or more conductors of a second group by electroless plating on the active layer, whereby portions of the active layer sandwiched between the conductors of the first and second groups are rendered conductive.

8 Claims, 3 Drawing Sheets

METHOD FOR FABRICATING HYBRID INTEGRATED CIRCUIT

This application is a continuation of Application Ser. No. 07/220,724 filed July 18, 1988 and now abandoned.

RELATED APPLICATION AND PATENT

This application is related to the copending U.S. Pat. Application Ser. No. 825,996 and the U.S. Pat. No. 4,685,203 assigned to the assignee of the present application.

BACKGROUND OF THE INVENTION

Field of the Invention

This invention pertains to a method for fabricating a hybrid IC (integrated circuit) substrate and particularly to a method for fabricating electric conductors integrated with high density on an insulator substrate.

Description of the Prior Art

FIG. 1 is a sectional view schematically showing a part of a ceramic circuit substrate disclosed in Japanese Patent Laying-Open No. 112681/1984. In FIG. 1, a tungsten conductor 102 belonging to a first group is formed on a ceramic substrate 101. The tungsten conductor 102 is covered with a nickel film 103 and a palladium film 104. A thick film of a silver-palladium conductor 105 belonging to a second group is electrically connected with the tungsten conductor 102 through the palladium film 104 and the nickel film 103. The nickel film 103 and the palladium film 104 are provided to improve adhesion and conductivity between the tungsten conductor 102 and the silver-palladium conductor 105.

The ceramic circuit substrate of FIG. 1 is fabricated in the following process. First, the tungsten conductor 102 is provided on a green sheet of ceramic and it is baked in a reducing atmosphere at 1600° C., whereby the ceramic substrate 101 to which the tungsten conductor 102 is firmly stuck is formed. The nickel film 103 is formed on the tungsten conductor 102 by electroless plating and the palladium film 104 is formed on the nickel film 103 by electroplating. After that, silver-palladium paste containing a glass component is printed in a predetermined pattern and it is baked in an oxidizing atmosphere at 900° C. As a result, the thick film conductor 105 of the second group fixedly stuck to the ceramic substrate 101 and electrically connected with the tungsten conductor 102 of the first group is formed.

FIG. 2 is a sectional view schematically showing a part of another ceramic circuit substrate. The circuit substrate of FIG. 2 is similar to that of FIG. 1, except that a thick film resistor 110 of ruthenium oxide is connected to the silver-palladium conductor 105. Although Japanese Patent Publication No. 112681/1984 does not mention a resistor of ruthenium oxide, it is well known to print and bake a paste containing ruthenium oxide on a ceramic substrate thereby to form a thick film resistor.

The conventional circuit substrate thus constructed is expensive because noble metallic materials such as silver and palladium need to be used. In addition, the palladium film 104 on the nickel film 103 is applied by electroplating and accordingly the pattern to be plated needs to be connected with a voltage source, which imposes limitation to pattern design. Moreover, the silver-palladium conductor is liable to dissolve into fused solder and it might cause trouble due to silver migration. There is involved another disadvantage that fine patterning is difficult because the silver palladium film is patterned by screen printing.

A method using copper paste instead of silver-palladium paste has been proposed to eliminate the above described disadvantages of the silver-palladium film. However, this method requires an accurate control of an atmosphere for baking of the copper paste and a large quantity of nitrogen is consumed. Accordingly, this method cannot always be said to be economical. Moreover, the copper paste needs to be baked in nitrogen, while the thick film resistor of ruthenium oxide needs to be baked in air, and accordingly if copper paste is used, such a thick film resistor of ruthenium oxide cannot not be used. For this reason, it is necessary to use as the resistor material a non-oxide material such as lanthanum hexaboride. Such material involves various drawbacks in characteristics, processing conditions and the like.

SUMMARY OF THE INVENTION

In view of the above described prior art, it is an object of the present invention to provide a method for fabricating a hybrid IC substrate at a reduced cost without using noble metals.

Another object of the present invention is to provide a method for easily fabricating a hybrid IC substrate having a fine pattern of conductor on a ceramic substrate with high precision.

According to an aspect of the present invention, a method for fabricating a hybrid IC substrate comprises the steps of: preparing an insulating ceramic substrate having a major surface; baking one or more conductors of a first group formed of high melting point metal or alloy thereof on the major surface; covering the conductors of the first group with a first plated film formed by electroless plating; forming, on the first plated film, an insulating porous active layer including a glass component and a small amount of a metal component having a catalytic action for electroless plating; and forming one or more conductors of a second group by electroless plating on the active layer, whereby a portion of the active layer sandwiched between the conductors of the first and second groups is conductive.

According to another aspect of the present invention, a method for fabricating a hybrid IC substrate comprises the steps of: preparing an insulating ceramic substrate having a major surface; baking one or more conductors of a first group formed of high melting point metal or alloy thereof on the major surface; covering the conductors of the first group with a first plated film formed by electroless plating; forming, on the first plated film and the major surface, an insulating porous active layer including a glass component and a small amount of a metal component having a catalytic action for electroless plating; covering the active layer with a photosensitive resist layer; patterning the resist layer by using a photomask; and forming one or more conductors of a second group by electroless plating on portions of the active layer not covered with the patterned resist layer, whereby a portions of the active layer sandwiched between the conductors of the first and second groups is rendered conductive and a portions of the active layer in direct contact with the insulating substrate is maintained as an insulator.

According to still another aspect of the present invention, a method for fabricating a hybrid IC substrate comprises the steps of: preparing an insulating ceramic substrate having a major surface; baking one or more conductors of a first group formed of high melting point metal or alloy thereof; covering the conductors of the first group with a first plated film formed by electroless plating; forming, on the first plated film and the major surface, an insulating porous active layer including a glass component and a small amount of a metal component having a catalytic action for electroless plating; covering the active layer with an electroless-plated conductor layer; and patterning the electroless-plated conductor layer by a photolithographic process to form one or more conductors of a second group, whereby a portion(s) of the active layer sandwiched between the conductors of the first and second groups is rendered conductive and a portion(s) of the active layer in direct contact with the insulating substrate is maintained as an insulator.

According to a further aspect of the present invention, a method for fabricating a hybrid IC substrate comprises the steps of: preparing an insulating ceramic substrate having a major surface; baking one or more conductors of a first group formed of high melting point metal or alloy thereof on the major surface; covering the conductors of the first group with a first plated film formed by electroless plating; baking a group of one or more resistors of cermet of metal oxide on the major surface; forming an insulating porous active layer including a glass component and a small amount of a metal component having a catalytic action for electroless plating on the first plated film, the resistors and the major surface with a predetermined pattern; and forming one or more conductors of a second group by electroless plating on the active layer, whereby the conductors of the first group and the group of the resistors can be electrically connected by the conductors of the second group.

According to a still further aspect of the present invention, a method for fabricating a hybrid IC substrate comprises the steps of: preparing an insulating ceramic substrate having a major surface; baking one or more conductors of a first group formed of high melting point metal or alloy thereof on the major surface; covering the conductors of the first group with a first plated film formed by electroless plating; baking a group of one or more resistors formed of cermet of metal oxide on the major surface; forming an insulating porous active layer including a glass component and a small amount of a metal component having a catalytic action for electroless plating on the first plated film, the resistors and the major surface with a predetermined pattern; covering the active layer with a photosensitive resist layer; patterning the resist layer by using a photomask; forming one or more conductors of a second group, by electroless plating on portions of the active layer not covered with the patterned resist layer, whereby the conductors of the first group and the group of the resistors can be electrically connected by the conductors of the second group which are electrically isolated from each other.

According to a still further aspect of the present invention, a method for fabricating a hybrid IC substrate comprises the steps of: preparing an insulating ceramic substrate having a major surface; baking one or more conductors of a first group formed of high melting point metal or alloy thereof on the major surface; covering the conductors of the first group with a first plated film formed by electroless plating; baking a group of one or more resistors formed of cermet of metal oxide on the major surface; forming an insulating porous active layer including a glass component and a small amount of a metal component having a catalytic action for electroless plating on the first plated film, the resistors and the major surface with a predetermined pattern; covering the active layer with an electroless-plated conductor layer; and patterning the electroless-plated conductor layer by a photolithographic process to form one or more conductors of a second group, whereby the conductors of the first group and the group of the resistors can be electrically connected by the conductors of the second group which are electrically isolated from each other.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
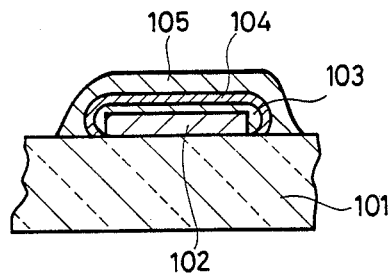
FIG. 1 is a sectional view schematically showing a part of a conventional hybrid IC substrate.
Figure 2:
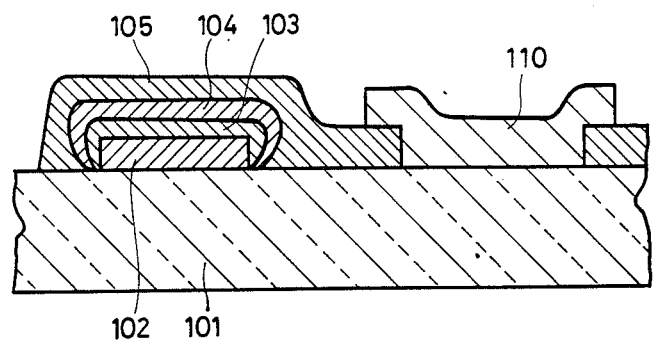
FIG. 2 is a sectional view schematically showing a part of another conventional hybrid IC substrate.
Figure 3:
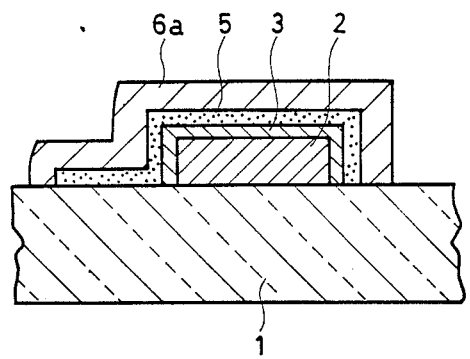
FIG. 3 is a sectional view schematically showing a part of a hybrid IC substrate fabricated by a method according to the present invention.

Referring to FIG. 3, first, a conductive paste of tungsten is printed on a green sheet of alumina according to a conductor pattern of a first group and it is baked at 1600° C., whereby a conductor 2 of tungsten of the first group is formed on the alumina substrate 1. Then, a catalyzer (e.g., palladium) for a first electroless plating is selectively absorbed only on the tungsten conductor 2. The substrate thus treated is immersed in a bath for electroless nickel-baron plating, so that the tungsten conductor 2 is covered with a first plated layer 3.

After that, an active layer 5 is formed with a predetermined pattern on the first plated layer 3 and the substrate 1. Although the active layer 5 is an insulator, it is porous and has a catalytic action for electroless plating. Such an active layer can be formed by baking of an active paste layer such as "CATAPASTE CCP-3730" available from OKUNO CHEMICAL INDUSTRY CO., LTD. Preferably, the active paste layer is formed by screen printing to have a uniform thickness. The active paste which can be used includes for example low melting point glass powder, alumina powder, palladium powder having a catalytic action for electroless plating, organic solvent and resin. The palladium powder contained in the paste is usually only about 0.5 wt%. When the active paste layer is baked at 600° C., the organic solvent or resin is dispersed and the active layer 5 is caused to contain palladium of about 1 wt%. On that occasion, the nickel boron plated layer 3 is exposed to a high temperature of 600° C. and oxidized and then the layer 3 serves to prevent oxidation of the tungsten conductor 2. Particularly, the plated layer 3 containing more than 99% of nickel effectively prevents oxidation of the tungsten conductor 2. If the active layer 5 is baked at a temperature lower than 400° C., electric connection cannot be obtained between the conductor 2 of the first group and a conductor 6a of the second group formed thereover later. On the other hand, if the active layer 5 is baked at a temperature higher than 900° C., an unfavorable influence is exerted on other circuit components and therefore baking at such a high temperature is not preferred.

The substrate on which the active layer 5 is joined is immersed in an electroless copper or nickel plating bath so that a second plated layer is deposited only on the active layer 5. Thus, the conductor 6a of the second group is formed.

The active layer 5 itself is an electric insulator. However, a portion of the active layer 5 over the conductor 2 of the first group includes an interdiffused conductor near the interface with the first plated layer 3. In addition, the active layer 5 is porous. Accordingly, an area of the active layer 5 sandwiched between the conductor 2 of the first group and the conductor 6a of the second group is rendered conductive (for example, 50 m$\Omega$/mm$^2$ or less in the sandwiched area) and thus the conductors 2 and 6a can be electrically connected. The active layer 5 serves to fixedly join the conductors 2 and 6a.

Accordingly, the conductor 6a of the second group can be electrically connected with the conductor 2 of the first group without providing a contact hole in the active layer 5. Furthermore, the conductor 6a of copper or nickel of the second group has a much lower cost compared with a silver-palladium conductor and it hardly dissolves into fused solder and has a good resistance to electromigration. Needless to say, the copper conductor has a good conductivity and it also has a good wettability for soldering.

Figure 4:
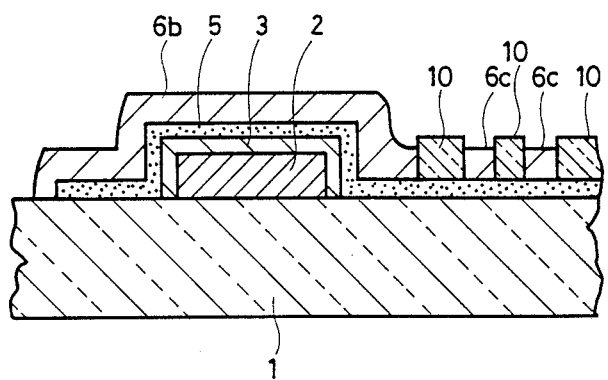
FIG. 4 is a sectional view schematically showing a part of another hybrid IC substrate fabricated by a method according to the present invention.

Referring to FIG. 4, another embodiment of the present invention will be described. The hybrid IC substrate of FIG. 4 is similar to that of FIG. 3, except that a resist pattern 10 is formed on the active layer 5 to separate conductors 6b, 6c and 6d of the second group from one another. In this embodiment of FIG. 4, a photosensitive resist layer is coated on the active layer 5 and dried. The resist layer is subjected to exposure and development by using a photomask having the conductor pattern of the second group, whereby the resist pattern 10 for electroless plating is formed. The substrate provided with the resist pattern 10 is immersed in an electroless plating bath so that conductors 6b, 6c and 6d of copper or nickel of the second group are formed by electroless plating on portions of the active layer 5 not covered with the resist pattern 10. Then, the conductors 2 and 6b are electrically connected.

On the other hand, the portions of the active layer in direct contact with the insulating substrate 1 are maintained as an insulator and the conductors 6b, 6c and 6d of the second group are electrically isolated from one another. For example, if the conductors 6c and 6d are separated by 0.1 mm, they are electrically isolated from each other by insulation resistance of more than $10^{13}\Omega$. Since the resist pattern 10 is formed by using the photomask, the conductors 6b, 6c and 6d of the second group can be formed with high precision and high density.

Figure 5:
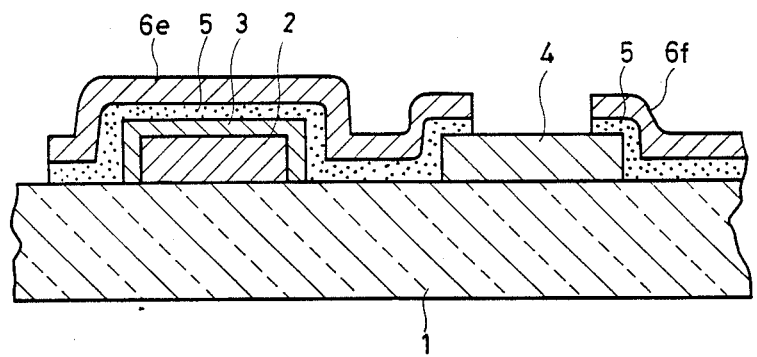
FIG. 5 is a sectional view schematically showing a part of still another hybrid IC substrate fabricated by a method according to the present invention.

Referring to FIG. 5, still another embodiment of the present invention will be described. The hybrid IC substrate of FIG. 5 is similar to that of FIG. 3, except that it further comprises a thick film of a resistor 4. After the tungsten conductor 2 and the first plated film 3 are formed, the thick film resistor 4 is formed by the steps of providing a pattern of a paste containing ruthenium oxide on the substrate 1 and baking the past pattern at 850° C. After that, the active layer 5 and conductors 6e and 6f of the second group are formed with a predetermined pattern. Thus, portions of the active layer 5 sandwiched between the resistor 4 and the conductors 6e and 6f of the second group are rendered conductive. Accordingly, the conductors 6e and 6f of the second group are electrically connected through the resistor 4. The conductor 2 of the first group is electrically connected with the resistor 4 through the conductor 6e of the second group.

Figure 6:
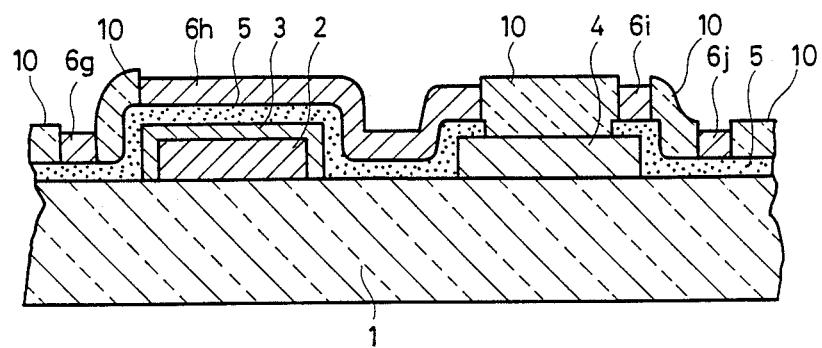
FIG. 6 is a sectional view schematically showing a part of a further hybrid IC substrate fabricated by a method according to the present invention.

Referring to FIG. 6, a further embodiment of the present invention will be described. The hybrid IC substrate of FIG. 6 is similar to that of FIG. 5, except that a resist pattern 10 is formed on the active layer 5 to separate conductors 6g, 6h, 6i and 6j of the second group from one another.

Incidentally, the above described active layer 5 may be formed by the steps of baking a paste layer including glass powder as a major component and further including alumina powder, organic solvent and resin to form a porous insulating layer having fine concavities and convexities on its surface and absorbing an amount of 1 wt% or less of a metal such as palladium having a catalytic action for electroless plating onto the insulating layer.

In addition, the conductors of the second group may be formed by the steps of forming a plated layer on the whole surface of the active layer without using a resist layer, and etching and patterning the plated layer by a photolithographic process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. The method for fabricating a hybrid IC substrate comprising the steps of:
    preparing an insulating ceramic substrate having a major surface;
    baking a first conductor, selected from a first group of high melting point metals, on said major surface;
    covering said first conductor with a first plated film formed by electroless plating;
    forming an insulating porous active layer including a glass component having a catalytic action for electroless plating on said first plated film, and
    forming a second conductor selected from a second group of metals by electroless plating on said active layer, and
    rendering portions of said active layer located between said conductors conductive, thereby bringing said conductors into electrical contact with each other through said active layer.

2. The method in accordance with claim 1, wherein said active layer is formed by applying a paste including a glass component and a small amount of metal having a catalytic action for electroless plating, and baking said paste.

3. The method in accordance with claim 2, wherein said active layer is baked at a temperature in the range from 400° to 900° C.

4. The method in accordance with claim 1, wherein said active layer is formed by baking a porous insulating layer including a glass component, and then absorbing a metal having a catalytic action for electroless plating into said insulating layer.

5. The method in accordance with claim 1, wherein said high melting point metal is tungsten.

6. The method in accordance with claim 1, wherein said first plated film is formed by electroless nickelboron plating.

7. A method in accordance with claim 1, wherein said first plated film contains 99 wt% or more of nickel.

8. The method for fabricating a hybrid IC substrate comprising the steps of:

preparing an insulating ceramic substrate having a major surface;

baking a tungsten metal conductor on said major surface;

covering said tungsten metal conductor with a first plated film formed by electroless nickel-baron plating;

baking a porous insulating active layer including a glass component having a catalytic action for electroless plating on said first plated film at a temperature in the range of from 400° C. to 900° C.; and forming a second metal conductor selected from a group of metals including copper and nickel by electroless plating on said active layer, and rendering portions of said active layer located between said tungsten metal conductor and said second metal conductor conductive, thereby bringing said conductors into electrical contact with each other through said active layer.

* * * * *